United States Patent
Schmidt et al.

(10) Patent No.: US 11,453,821 B2
(45) Date of Patent: Sep. 27, 2022

(54) NARROW BAND EMITTING SIALON PHOSPHOR

(71) Applicant: Lumileds LLC, San Jose, CA (US)

(72) Inventors: Peter Josef Schmidt, Aachen (DE); Philipp-Jean Strobel, Aachen (DE); Volker Weiler, Aachen (DE); Andreas Tücks, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/110,080

(22) Filed: Dec. 2, 2020

(65) Prior Publication Data

US 2021/0171827 A1    Jun. 10, 2021

Related U.S. Application Data

(60) Provisional application No. 62/944,025, filed on Dec. 5, 2019.

(30) Foreign Application Priority Data

Jan. 10, 2020   (EP) ..................... 20151188

(51) Int. Cl.
   *C09K 11/77*     (2006.01)
   *C09K 11/08*     (2006.01)
   (Continued)

(52) U.S. Cl.
   CPC ...... *C09K 11/0883* (2013.01); *C01B 21/0826* (2013.01); *C09K 11/77348* (2021.01); *H01L 33/502* (2013.01); *C01P 2006/60* (2013.01)

(58) Field of Classification Search
   CPC .......... C09K 11/7734; C09K 11/77342; C09K 11/77344; C09K 11/77346; C09K 11/77347; C09K 11/77348
   See application file for complete search history.

(56) References Cited

U.S. PATENT DOCUMENTS

| 9,546,319 B2 | 1/2017 | Schmidt et al. |
| 2006/0033081 A1* | 2/2006 | Hintzen ............... H01L 33/502 |
| | | 252/301.4 F |

(Continued)

FOREIGN PATENT DOCUMENTS

| WO | 2018/087304 A1 | 5/2018 |
| WO | WO2019188319 | * 10/2019 |

OTHER PUBLICATIONS

Li, Y. Q. (2005). Structure and luminescence properties of novel rare-earth doped silicon nitride based materials. Technische Universiteit Eindhoven. https://doi.org/10.6100/IR594350 (Year: 2005).*

(Continued)

*Primary Examiner* — Matthew E. Hoban (57) ABSTRACT

This specification discloses a method of enhancing the stability and performance of $Eu^{2+}$ doped narrow band red emitting phosphors. The resulting phosphor compositions are characterized by crystallizing in ordered structure variants of the $UCr_4C_4$ crystal structure type and having a composition of $AE_{1-x}Li_{3-2y}Al_{1+2y-z}Si_zO_{4-4y-z}N_{4y+z}:EU_x$ (AE=Ca, Sr, Ba; $0<x<0.04$, $0\leq y<1$, $0<z<0.05$, $y+z\leq 1$). It is believed that the formal substitution $(Al,O)^+$ by $(Si,N)^+$ reduces the concentration of unwanted $Eu^{3+}$ and thus enhances properties of the phosphor such as stability and conversion efficiency.

17 Claims, 8 Drawing Sheets

(51) Int. Cl.
*H01L 33/50* (2010.01)
*C01B 21/082* (2006.01)

(56) References Cited

U.S. PATENT DOCUMENTS

2013/0003346 A1* 1/2013 Letoquin ............... F21S 8/033
                                                      362/84
2017/0345975 A1* 11/2017 Schmidt ............. C09K 11/7734
2021/0017448 A1* 1/2021 Toyoshima ........ C09K 11/7734

OTHER PUBLICATIONS

Hoerder. Sr[Li2Al2O2N2]:Eu2+—A high performance red phosphor to brighten the future. Nat Commun. 2019; 10: 1824. Published online Apr. 23, 2019 (Year: 2019).*

The extended European search report corresponding to EP 20151188.8, dated Jul. 3, 2020, 4 pages.

From the EPO as the ISA, Notification of Transmittal of the International Search Report and the Written Opinion of the International Searching Authority, or the Declaration, PCT/US2020/063385, dated Apr. 15, 2021, 10 pages.

* cited by examiner

NARROW BAND EMITTING SIALON PHOSPHOR

This application claims benefit of priority to U.S. Provisional Patent Application 62/944,025 filed Dec. 5, 2019 and to European Patent Application 20151188.8 filed Jan. 10, 2020, each of which is incorporated herein by reference in its entirety.

FIELD OF THE INVENTION

The invention relates generally to phosphors and phosphor-converted light emitting diodes, and more particularly to narrow band emitting Si AlON phosphors, to methods for making them, and to phosphor converted light emitting diodes comprising them.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Phosphor converted LEDs that comprise narrow band red emitting phosphors of composition $A_{a-z}-B_b-C_c-X_x:Eu_z$ with A=(Sr,Ba,Ca,La,Lu); B=(Li,Mg); C=(Si,Al,B,Ga,P, Ge); X=(N,O,S,F,Cl); and $0.5 \leq c/x \leq 0.75$ showing for example an eightfold coordination of the activator ion by its ligands and activator contact lengths in the 210-320 pm range are disclosed in WO 2010/131133 A1. Examples of such Eu doped phosphor materials are for example homeotypic $SrLiAl_3N_4$:Eu (SLA) or $SrLi_2Al_2O_2N_2$:Eu (SLAO) disclosed in U.S. Pat. No. 9,546,319 B2 and WO 2018/087304 A1, respectively.

A known issue of such Eu doped phosphor materials is the tendency to incorporate the Eu activator not only in the preferred divalent state but also in the non-wanted trivalent state. An article entitled "Pressure-Controlled Synthesis of High-Performance $SrLiAl_3N_4$:$Eu^{2+}$ Narrow-Band Red Phosphors" by Fang et al. (J. Mater. Chem. C, 2018, DOI: 10.1039/C8TC03025A) teaches a process of elevating the gas pressure during the synthesis, leading to a slightly decreased unit ceil volume, an increased quantum efficiency and an increased $Eu^{2+}/Eu^{3+}$ ratio, eventually enhancing the luminescence intensity of the SLA phosphor material.

The present inventors found however that phosphor materials like SLAO cannot be enhanced in their properties as is SLA by applying high process gas pressures. While in SLA the average alkaline earth cation size can only be decreased by replacing part of Sr (increased chemical pressure), the opposite has been observed by the present inventors for SLAO in which Ca is not soluble but the larger Ba atom (decreased chemical pressure) is. Since the lattice compressibility should show the same tendency as the unit cell volume change by cation substitution another $Eu^{2+}$ stabilization mechanism is needed to provide SLAO type phosphor materials with improved properties.

SUMMARY

This specification discloses a method of enhancing the stability and performance of $Eu^{2+}$ doped narrow band red emitting phosphors. The resulting phosphor compositions are characterized by crystallizing in ordered structure variants of the $UCr_4C_4$ crystal structure type and having a composition of $AE_{1-x}Li_{3-2y}Al_{1+2y-z}Si_zO_{4-4y-z}N_{4y+z}:EU_x$; (AE=Ca, Sr, Ba; 0<x<0.04, 0≤y<1, 0<z<0.05, y+z≤1). It is believed that the formal substitution $(Al,O)^+$ by $(Si,N)^+$ reduces the concentration of unwanted $Eu^{3+}$ and thus enhances properties of the phosphor such as stability and conversion efficiency.

These compositions may be viewed as a stabilized version of SLAO emitting in, for example, the 612-620 nm range with, for example, FWHM≤55 nm. They are believed to solve the issue of a low operation lifetime of pcLEDs comprising a narrow band red emitting SLAO type phosphor by changing the defect chemistry of the SLAO material by addition of silicon to form novel SiAlON compositions that crystallize in the SLAO structure type.

Preferably, the Si concentration in the host lattice is in about the same range as the Eu doping concentration.

One subgenus, with y=½ has composition $AE_{1-x}Li_2Al_{2-z}Si_zO_{2-z}N_{2+z}:Eu_x$.

The novel phosphor compositions disclosed in this specification may be employed, for example, in white light emitting pcLEDs, for example with color rendering index (CRT) of 90 or greater, and in red emitting pcLEDs.

Other embodiments, features and advantages of the present invention will, become more apparent to those skilled in the art when taken with reference to the following more detailed description of the invention in conjunction with the accompanying drawings that are first briefly described.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
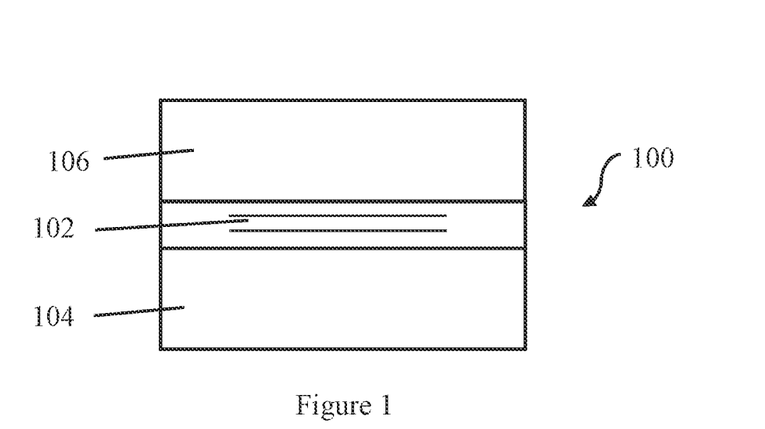
FIG. 1 shows a schematic cross-sectional view of an example pcLED.

FIG. 1 shows an example of an individual pcLED 100 comprising a light emitting semiconductor diode structure 102 disposed on a substrate 104, together considered herein an "LED", and a phosphor layer 106 disposed on the LED. Light emitting semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, and II-VI materials.

Any suitable phosphor materials may be used, depending on the desired optical output from the pcLED.

Figure 2A:
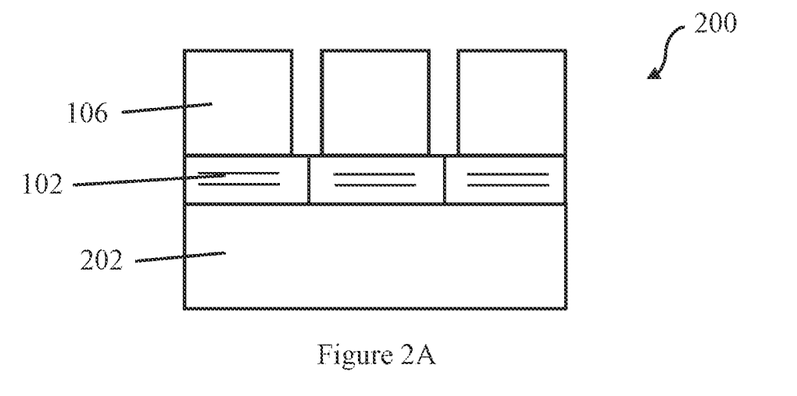
FIGS. 2A and 2B show, respectively, cross-sectional and top schematic views of an array of pcLEDs.
Figure 2B:
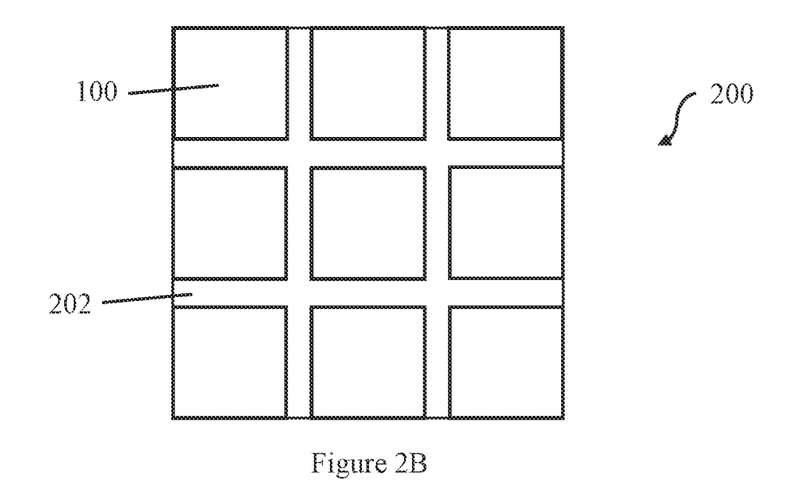

FIGS. 2A-2B show, respectively, cross-sectional and top views of an array 200 of pcLEDs 100 including phosphor pixels 106 disposed on a substrate 202. Such an array may include any suitable number of pcLEDs arranged in any suitable manner. In the illustrated example the array is depicted as formed monolithic-ally on a shared substrate, but alternatively an array of pcLEDs may be formed from separate individual pcLEDs. Substrate 202 may optionally comprise CMOS circuitry for driving the LED, and may be formed from any suitable materials.

Figure 3A:
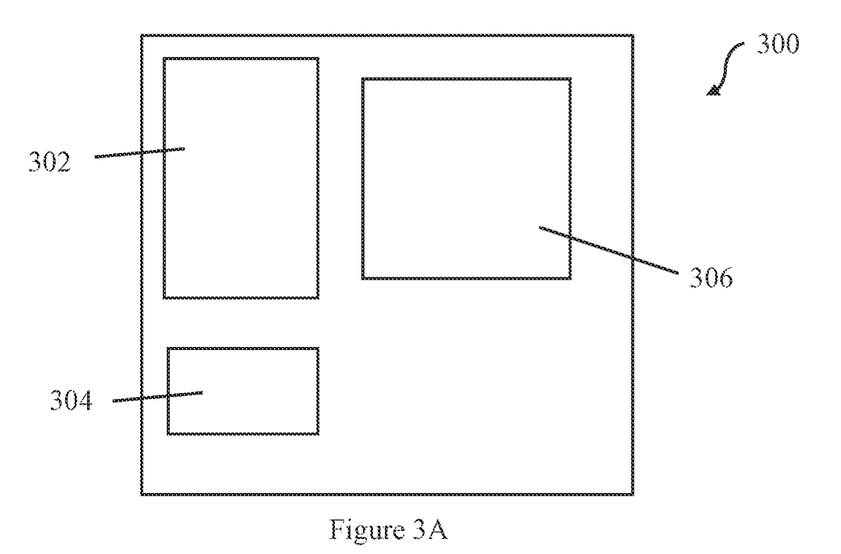
FIG. 3A shows a schematic top view of an electronics board on which an array of pcLEDs may be mounted, and FIG. 3B similarly shows an array of pcLEDs mounted on the electronic board of FIG. 3A.
Figure 3B:
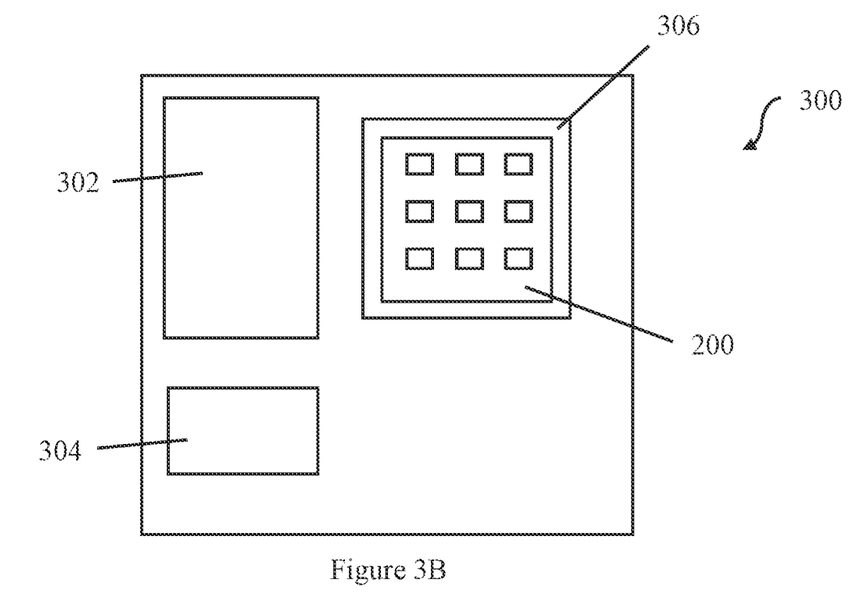

As shown in FIGS. 3A-3B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

Figure 4A:
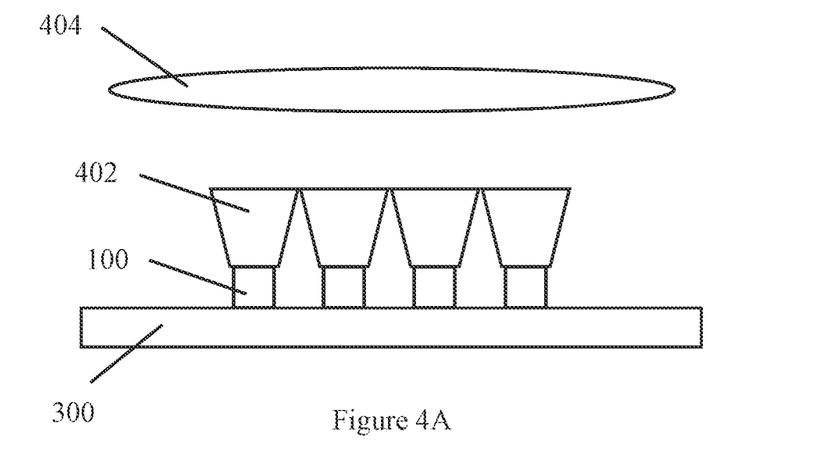
FIG. 4A shows a schematic cross sectional view of an array of pcLEDs arranged with respect to waveguides and a projection lens.
Figure 4B:
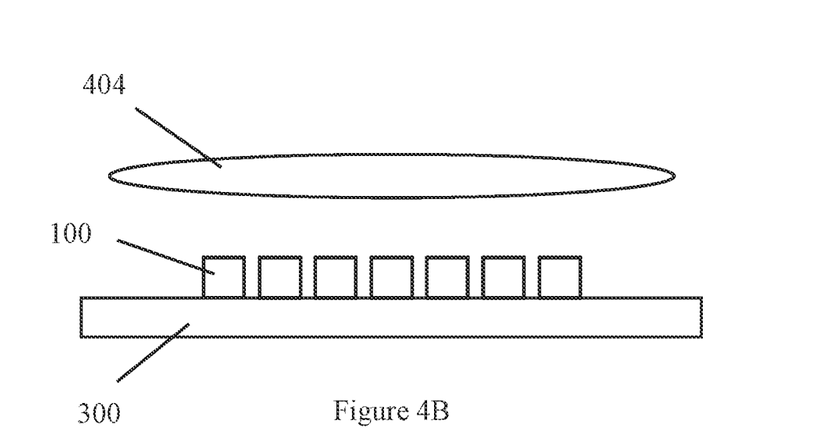
FIG. 4B shows an arrangement similar to that of FIG. 4A, without the waveguides.

Individual pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 4A-4B a pcLED array 200 (for example, mounted on an electronics board 300) may be arranged in combination with secondary optical elements such as waveguides, lenses, or both for use in an intended application. In FIG. 4A, light emitted by pcLEDs 100 is collected by waveguides 402 and directed to projection lens 404. Projection lens 404 may be a Fresnel lens, for example. This arrangement may be suitable for use, for example, in automobile headlights. In FIG. 4B, light emitted by pcLEDs 100 is collected directly by projection lens 404 without use of intervening waveguides. This arrangement may particularly be suitable when pcLEDs can be spaced sufficiently close to each other, and may also be used in automobile headlights as well as in camera flash applications. A microLED display application may use similar optical arrangements to those depicted in FIGS. 4A-4B, for example. Generally, any suitable arrangement of optical elements may be used in combination with the pcLEDs described herein, depending on the desired application.

As summarized above, this specification discloses a novel phosphor composition with superior luminescence properties compared to know phosphor compositions with isotypic crystal structures.

In particular, the inventors found that an improved SLAO type phosphor material can be obtained by co-doping the host lattice with Si to form SiAlON compounds. It is believed by the inventors that the formal substitution $(Al,O)^+$ by $(Si,N)^+$ reduces the concentration of unwanted $Eu^{3+}$ by increasing the concentration of the highly charged $Si^{4+}$ in the host lattice and thus enhances the stability and conversion efficiency of the phosphor material by suppressing the formation of $Eu^{3+}$ by oxidation of the $Eu^{2+}$ dopant. This is advantageous because a lower tendency to form unwanted $Eu^{3+}$ during operation of a phosphor converted LED comprising an SLAO type phosphor is desired to increase the reliability of such a device.

Specifically, the phosphor materials have composition $AE_{1-x}Li_{3-2y}Al_{1+2y-z}Si_zO_{4-4y-z}N_{4y+z}:Eu_x$ (AE=Ca, Sr, Ba; $0<x<0.04$, $0.4<y<0.6$, $0<z<0.05$), where part of the aluminum of the host lattice is being replaced by silicon to form SiAlON type of formulations. To maintain charge neutrality of the host lattice also a part of the oxygen atoms are being replaced by nitrogen atoms. In other words, $(Al,O)^+$ pairs are being replaced charge neutral by $(Si,N)^+$ pairs in the phosphor host lattice.

The Si concentration should be in the range of the Eu activator concentration. If the activator concentration x is for example 0.005, the Si concentration should preferably be in the range 0.001 to 0.02, more preferably in the range 0.0025 to 0.015. More generally, referring to the formula above characterizing the phosphor composition, preferably $1/5 \leq z/x \leq 4$; more preferably $1/2 \leq z/x \leq 3$.

A preferred option to incorporate Si into the phosphor to form a SiAlON composition is via a nitride material such as for example silicon nitride. Even more preferred is the incorporation via $Eu_2Si_5N_8$ which also acts as Eu precursor with Eu in the divalent state and a Eu/Si ratio in the preferred range. The inventors found that $Eu_2Si_5N_8$ can be easily prepared from commercially available europium oxide, carbon and silicon nitride powders. $Eu_2Si_5N_8$ can be used as the only source of Eu dopant or it can be mixed with other sources like, for example, $Eu_2O_3$, $EuF_3$ or EuN.

In the following, examples for carrying out the invention are given.

Figure 5:
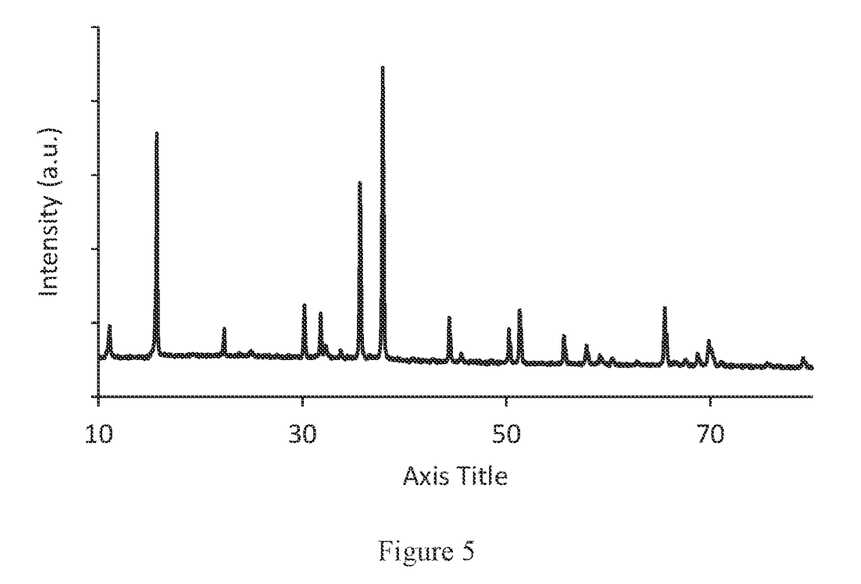
FIG. 5 shows a powder x-ray diffraction spectrum for the phosphor product of comparative Example A, $Sr_{0.995}Li_2Al_2O_2N_2:Eu_{0.005}$, described below.

Example A—Comparative Example, Synthesis of $Sr_{0.995}Li_2Al_2O_2N_2:Eu_{0.005}$ 30.312 g Strontium hydride (Materion, 99.5%), 17.202 g Lithium aluminum nitride prepared from Lithium nitride (Materion, 99.5%) and aluminum nitride (Tokuyama, grade F), 23.1746 g aluminum oxide (Baikowski, SP-DBM), 0.2988 g europium oxide (Neo, 4N), and 0.3733 g lithium fluoride (Aldrich, 99.99%) are mixed in a ball mill and fired at 730° C. setting temperature under nitrogen in a graphite furnace for 24 hrs. After ball milling in ethanol, the phosphor powder is dried and screened by sieving. FIG. 5 shows the x-ray diffraction (XRD) powder pattern of the powder product, indicating that it crystallizes in the tetragonal crystal structure of SLAO with lattice parameters $a_0$=7.950 Å and $c_0$=3.183 Å.

Figure 6:
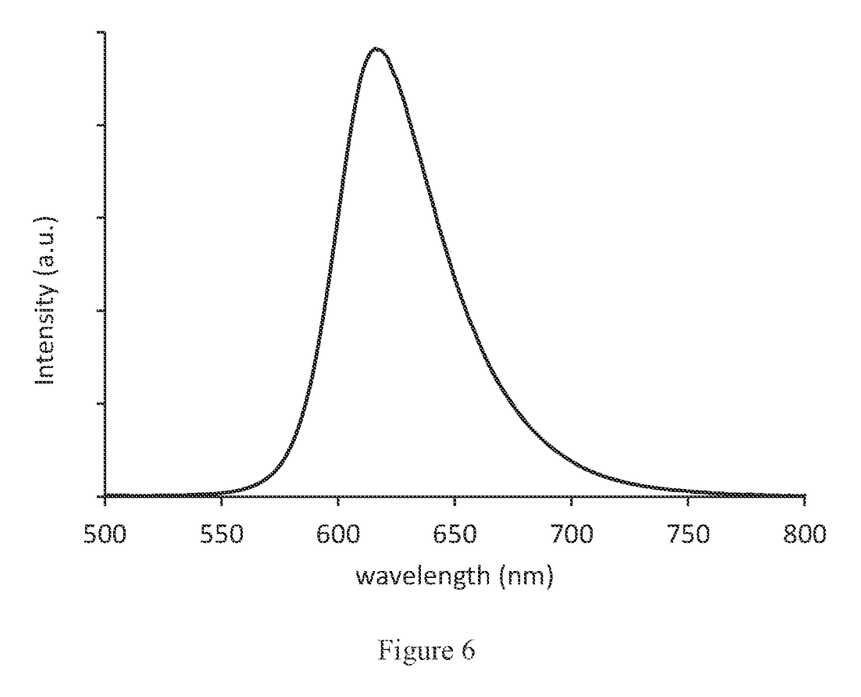
FIG. 6 shows an emission spectrum for the phosphor product of comparative Example A.
Figure 7:
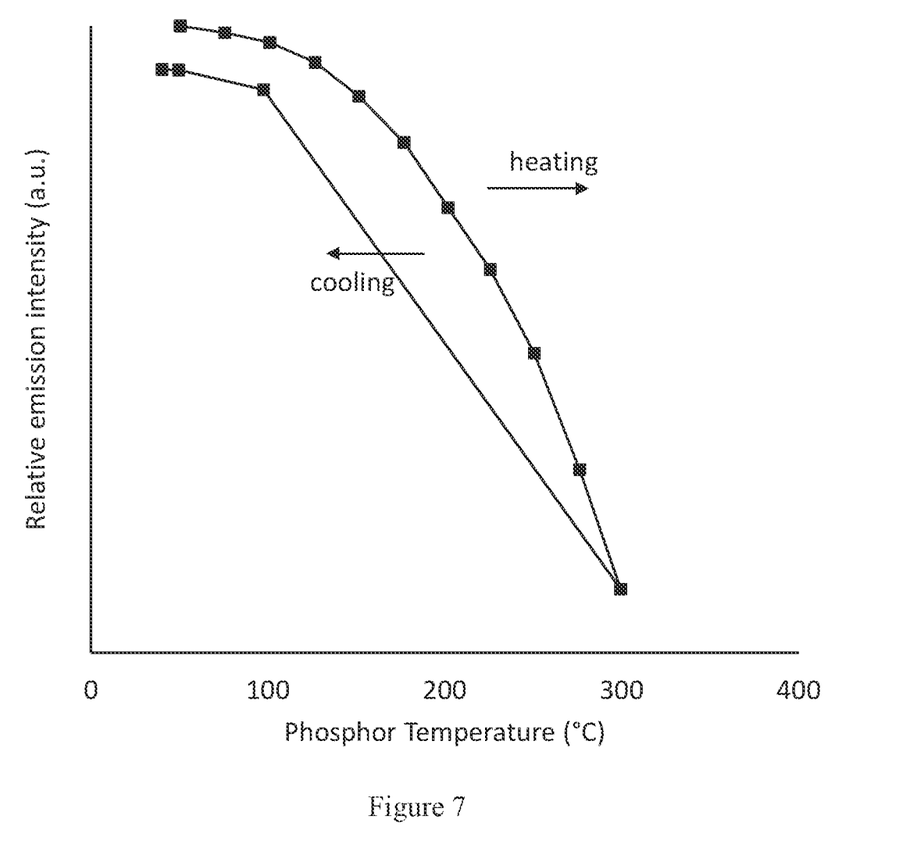
FIG. 7 shows the thermal behavior of the emission intensity of the phosphor product of comparative Example A.

The powder shows a peak emission at 618 nm with an emission half width of 53 nm if excited with 440 nm blue light (FIG. 6). The emission stability is assessed by heating a powder sample in air under 450 nm illumination and monitoring the emission intensity. The sample is first heated to 300° C. in 25K steps with 20 min dwell times and then cooled down. The drop in emission intensity with temperature is due to thermal quenching of the luminescence. After cooling down the emission signal is not fully recovered. FIG. 7 shows the relative emission intensity of the power sample as a function of the heating and cooling temperature. A 5% loss due to irreversible degradation is observed.

Figure 8:
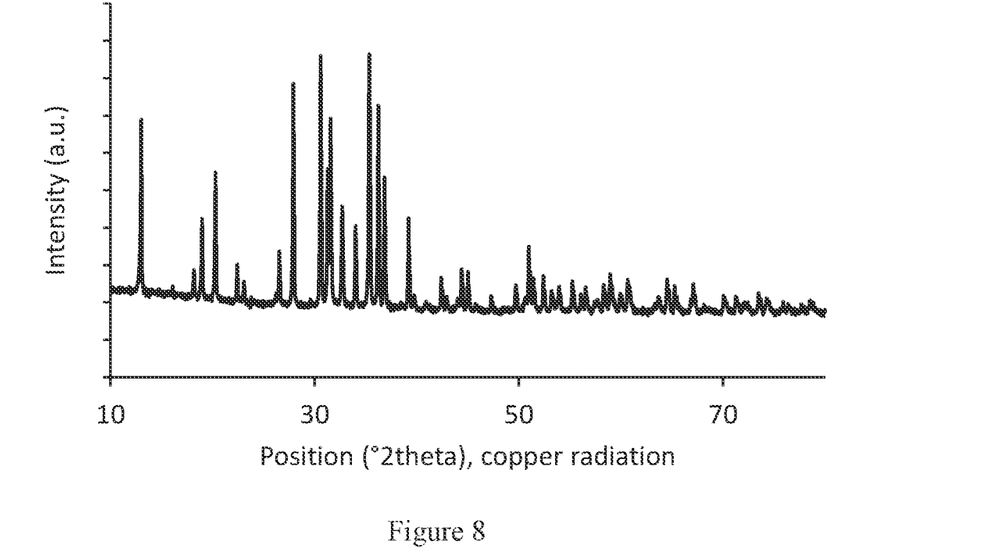
FIG. 8 shows a powder x-ray diffraction pattern for the synthesis product of Example B, reagent $Eu_2Si_2N_8$, described below.

Examples B—Synthesis of $Eu_2Si_5N_8$ 37.3 g silicon nitride (USE, >98.5%), 57.3 g europium oxide (NEO, 99.99%) and 6.45 g graphite (Alfa Aesar, microcrystal grade) are mixed by ball milling in cyclohexene, dried and transferred into a tube furnace. After firing at 1550° C. under a forming gas atmosphere (5% $H_2$, 95% $N_2$) for 8 h, the resulting $Eu_2Si_5N_8$ powder is ball milled in isopropanol and finally dried. FIG. 8 shows the XRD powder pattern of the $Eu_2Si_5N_8$ powder, indicating that it crystalizes in an orthorhombic lattice of the $Ba_2Si_5N_8$ structure type with cell constants $a_0$=5.7125 Å, $b_0$=6.793 Å, $c_0$=9.347 Å.

Example C—Synthesis of $Sr_{0.995}Li_2Al_2Si_{0.0125}O_{1.9875}N_{2.0125}:Eu_{0.005}$

Figure 9:
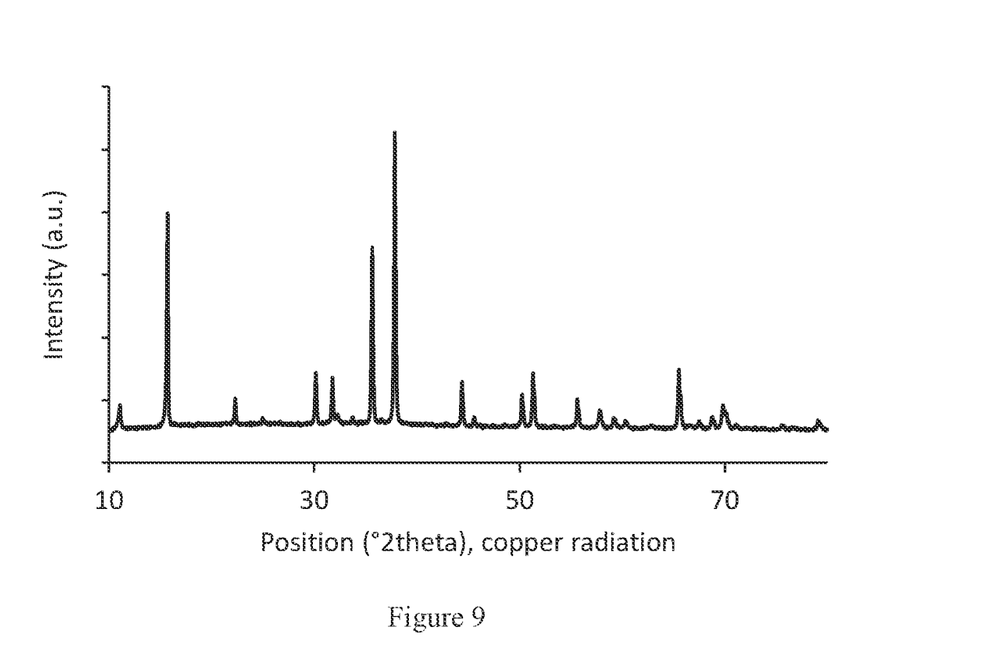
FIG. 9 shows a powder x-ray diffraction pattern for Example C, $Sr_{0.995}Li_2Al_2Si_{0.0125}O_{1.9875}N_{2.0125}:Eu_{0.005}$, described below.

30.324 g Strontium hydride (Materion, 99.5%), 17.185 g Lithium aluminum nitride prepared from Lithium nitride (Materion, 99.5%) and aluminum nitride (Tokuyama, grade F), 23.111 g aluminum oxide (Baikowski, SP-DBM), 0.473 g europium nitridosilicate (from Example B), and 0.307 g lithium fluoride (Aldrich, 99.99%) are mixed in a ball mill and fired at 730° C. setting temperature under nitrogen in a graphite furnace for 24 hrs. After ball milling in ethanol, the phosphor powder is dried and screened by sieving. FIG. 9 shows the XRD powder pattern of the powder product, indicating that it crystallizes in the tetragonal crystal structure of SLAO with lattice parameters $a_0$=7.948 Å and $c_0$=3.185 Å.

Figure 10:
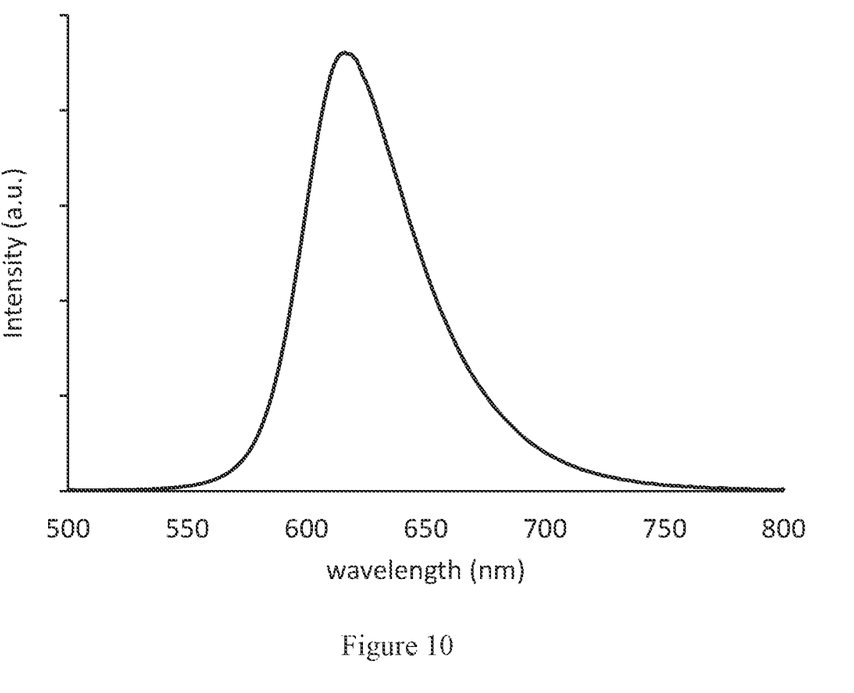
FIG. 10 shows an emission spectrum for the phosphor product of Example C.
Figure 11:
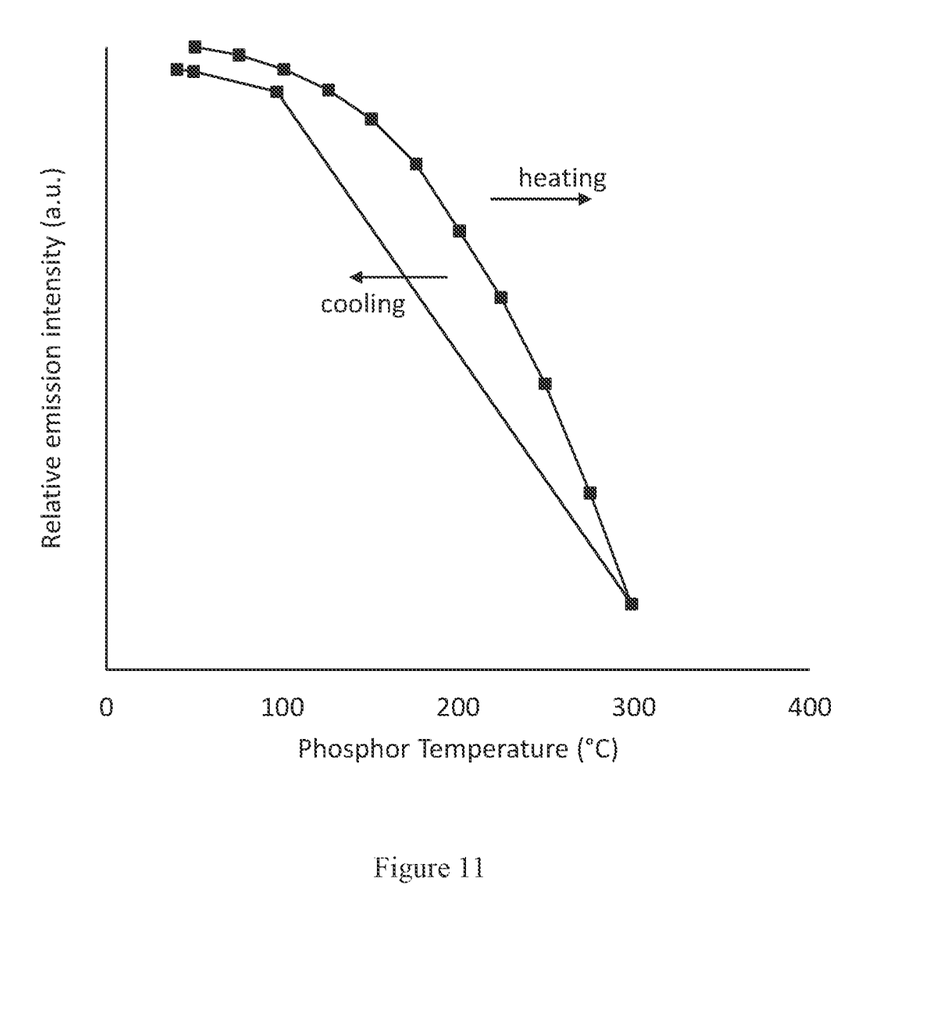
FIG. 11 shows the thermal behavior of the emission intensity of the phosphor product of Example C.

FIG. 10 shows the emission spectrum of the powder for 440 nm excitation wavelength. The emission shows a maximum at 616 nm and an emission half width of 54 nm. FIG. 11 shows the thermal behavior of the emission intensity of the powder for this example as measured with the same method as used for Example C. While the heating up part, of the measurement, is nearly identical with the one obtained for Example A, the irreversible degradation of the emission intensity is significantly lowered from 5% to 2%.

This disclosure is illustrative and not limiting. Further modifications will be apparent to one skilled in the art in light of this disclosure and are intended to fall within the scope of the appended claims.

The invention claimed is:

1. A luminescent composition of matter characterized by the formula:

$AE_{1-x}Li_{3-2y}Al_{1+2y-z}Si_zO_{4-4y-z}N_{4y+z}:EU_x$;

AE=Ca, Sr, Ba;
0<x<0.04;
0.4<y<0.6;
0<z<0.05; and
a concentration of Si is in a range of a concentration of Eu so that $\frac{1}{5} \leq z/x \leq 4$,
the luminescent composition of matter having a tetragonal crystal structure.

2. The luminescent composition of matter of claim 1, wherein y is equal to or about equal to 0.5.

3. The luminescent composition of matter of claim 1, crystalized in a $UCr_4C_4$ type crystal structure.

4. The luminescent composition of matter of claim 1, emitting light with an emission peak having a peak wavelength in the range 612 nm to 620 nm and a full width at half maximum ≤55 nm.

5. The luminescent composition of matter of claim 1, wherein $\frac{1}{2} \leq z/x \leq 3$.

6. The luminescent composition of matter of claim 1 wherein y is equal to or about equal to 0.5, crystalized in a $UCr_4C_4$ type crystal structure.

7. The luminescent composition of matter of claim 6, emitting light with an emission peak having a peak wavelength in the range 612 nm to 620 nm and a full width at half maximum ≤55 nm.

8. A method for making the luminescent composition of matter of claim 1, comprising
preparing lithium aluminum nitride from lithium nitride and aluminum nitride,
mixing $Eu_2Si_5N_8$ with the lithium aluminum nitride, an oxide, and at least one of a strontium compound, a calcium compound, and a barium compound; and
firing the mixture under nitrogen.

9. A light emitting device comprising:
a semiconductor light emitting device; and
a phosphor composition characterized by the formula $AE_{1-x}Li_{3-2y}Al_{1+2y-z}Si_zO_{4-4y-z}N_{4y+z}:EU_x$;

AE=Ca, Sr, Ba;
0<x<0.04;
0.4<y<0.6;
0<z<0.05; and
a concentration of Si is in a range of a concentration of Eu so that $\frac{1}{5} \leq z/x \leq 4$;
the phosphor composition having a tetragonal crystal structure and positioned to absorb light emitted by the semiconductor light emitting device and in response emit light of a longer wavelength.

10. The light emitting device of claim 9, wherein a combined light output from the semiconductor light emitting device and the phosphor composition includes light with an emission peak having a peak wavelength in the range 612 nm to 620 nm and a full width at half maximum ≤55 nm and is perceived as white by a human with normal color vision.

11. The light emitting device of claim 10, wherein the combined light output from the semiconductor light emitting device and the phosphor composition includes light with an emission peak having a peak wavelength in the range 612 nm to 620 nm and a full width at half maximum ≤55 nm and is characterized by a CRI of 90 or greater.

12. The method of claim 8, wherein the firing the mixture is performed at 730 C.

13. The method of claim 8, wherein the oxide compound is aluminum oxide.

14. The method of claim 8, further comprising mixing lithium fluoride with the $Eu_2Si_5N_8$, the lithium aluminum nitride, the oxide, and the at least one of a strontium compound, a calcium compound, and a barium compound.

15. The method of claim 8, further comprising preparing the $Eu_2Si_5N_8$, preparing the $Eu_2Si_5N_8$ comprising:
mixing europium oxide, silicon nitride and a carbon powder; and
firing the mixture under a gas atmosphere comprising $H_2$ and $N_2$.

16. The method of claim 8, wherein the at least one of a strontium compound, a calcium compound, and a barium compound is strontium hydride.

17. The method of claim 8, further comprising mixing one or more of $Eu_2O_3$, $EuF_3$, and EuN with the $Eu_2Si_5N_8$, the lithium aluminum nitride, the oxide, and the at least one of a strontium compound, a calcium compound, and a barium compound.

* * * * *